United States Patent
Ozono et al.

(10) Patent No.: US 7,632,374 B2
(45) Date of Patent: Dec. 15, 2009

(54) METHOD AND APPARATUS FOR PICKING UP SEMICONDUCTOR CHIP AND SUCTION AND EXFOLIATION TOOL USED THEREFOR

(75) Inventors: Mitsuru Ozono, Chikushino (JP); Teruaki Kasai, Chikushino (JP)

(73) Assignee: Panasonic Corporation, Osaka (JP)

( * ) Notice: Subject to any disclaimer, the term of this patent is extended or adjusted under 35 U.S.C. 154(b) by 485 days.

(21) Appl. No.: 10/620,184

(22) Filed: Jul. 15, 2003

(65) Prior Publication Data

US 2004/0038498 A1   Feb. 26, 2004

(30) Foreign Application Priority Data

Jul. 17, 2002   (JP) .............................. 2002-208382
Aug. 30, 2002   (JP) .............................. 2002-254310

(51) Int. Cl.
*B32B 38/10* (2006.01)
(52) U.S. Cl. ........................ 156/344; 156/584; 438/464; 438/976
(58) Field of Classification Search ................. 156/344, 156/584; 438/464, 976
See application file for complete search history.

(56) References Cited

U.S. PATENT DOCUMENTS

| | | | | |
|---|---|---|---|---|
| 4,778,326 A | | 10/1988 | Althouse et al. | |
| 4,798,645 A | * | 1/1989 | Pak | 156/344 |
| 6,032,997 A | * | 3/2000 | Elliott et al. | 294/64.1 |
| 6,709,543 B2 | * | 3/2004 | Kurosawa | 156/344 |
| 2001/0029088 A1 | * | 10/2001 | Odajima et al. | 438/464 |
| 2002/0067982 A1 | | 6/2002 | Yasamura et al. | |
| 2003/0070517 A1 | * | 4/2003 | Tsujimoto | 83/13 |

FOREIGN PATENT DOCUMENTS

| | | | |
|---|---|---|---|
| EP | 0 526 885 A2 | | 2/1993 |
| JP | 01235247 A | | 9/1989 |
| JP | 05-335405 | | 12/1993 |
| JP | 06-061347 | | 3/1994 |
| JP | 11-274181 | | 10/1999 |
| JP | 2000-195877 A | | 7/2000 |
| JP | 2000-299297 | | 10/2000 |
| JP | 2000353710 A | * | 12/2000 |
| JP | 2001-118862 | | 4/2001 |

* cited by examiner

*Primary Examiner*—Mark A Osele
(74) *Attorney, Agent, or Firm*—Pearne & Gordon LLP

(57) ABSTRACT

In an adhesive sheet exfoliation process in a pick-up operation for a thin-type chip 6 adhered to the adhesive sheet 5, a suction exfoliation tool 22 provided at its adhesion surface 22a with plural suction grooves 22b is abutted against the lower surface of the adhesive sheet 5. Then, air within the suction grooves 22b are vacuum-sucked to bend and deform the adhesive sheet 5 together with the chip 6 thereby to exfoliate the adhesive sheet 5 from the lower surface of the chip 6 due to such bending deformation. Thus, it is possible to realize the picking-up operation with high productivity without causing a problem such as breakage or crack.

9 Claims, 9 Drawing Sheets

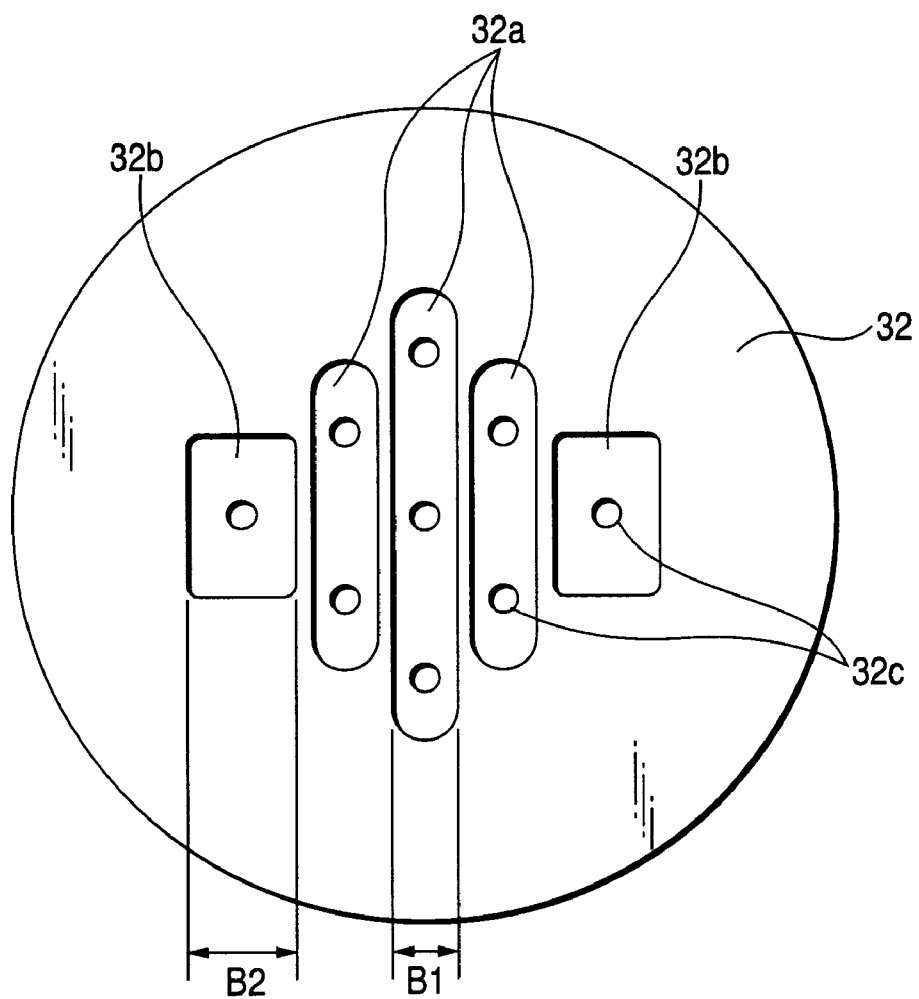

METHOD AND APPARATUS FOR PICKING UP SEMICONDUCTOR CHIP AND SUCTION AND EXFOLIATION TOOL USED THEREFOR

BACKGROUND OF THE INVENTION

The present invention relates to a method and an apparatus for picking up a semiconductor chip and a suction and exfoliation tool for picking up a semiconductor chip which is cut out from a wafer and adhered to an adhesive sheet.

Semiconductor chips have been made thinner due to the recent miniaturization of electronic parts, and semiconductor chips with quite small thickness of 100 µm or less have been put to practical use. However, since such semiconductor chips thus thinned are apt to be broken quite easily, it is difficult to handle the semiconductor chips. In particular, it is quite difficult to take out respective pieces of semiconductor chips cut out from a wafer. In this taking-out procedure, such a procedure is repeatedly performed that the semiconductor chips adhered to an adhesive sheet are exfoliated one by one from the sheet and picked up by a suction nozzle. However, when the conventionally employed semiconductor chip exfoliating method, that is, the method of raising the semiconductor chips by a needle from the lower part of the sheet is employed, there arises a problem that breakage or crack etc. may appear frequently at the semiconductor chips.

In order to eliminate such a problem, recently there has been employed a method that the sheet is exfoliated from the lower surfaces of the semiconductor chips by vacuum suction force when taking out the semiconductor chips from the sheet. According to this method, since it is not necessary to raise the semiconductor chips by the needle, it is possible to prevent the problem such as breakage or chip of the semiconductor chips from occurring. Such technique is disclosed, for example, in JP-A-2001-118862.

However, according to the aforesaid method, it is difficult to exfoliate the sheet from the semiconductor chips merely by vacuum-sucking the sheet from the lower surface thereof, so that an auxiliary means for accelerating the exfoliating process of the sheet is required to be employed jointly. For example, such an exfoliation acceleration process is required to be employed jointly that the vacuum sucking surface is moved relatively on the lower surface of the sheet along the lower surface to lower an adhesive force between the sheet and the chip. To this end, it is required to control a mechanical system in a complicated manner, and further a tact time is required due to the repetition of a complicated operation at every picking-up operation thereby to cause a delay time, so that it is impossible to realize a high productivity.

SUMMARY OF THE INVENTION

Accordingly, an object of the invention is to provide a method and an apparatus for picking up a semiconductor chip and a suction and exfoliation tool which can prevent breakage and crack and realize high productivity as to a thin-type semiconductor chip.

According to first aspect of the invention, a semiconductor chip pick-up method for picking up a semiconductor chip adhered to a sheet by using a pick-up head, includes: a sheet exfoliating step of abutting a suction surface of a sheet exfoliation mechanism against a lower surface of the sheet and performing vacuum-sucking through the suction surface thereby to exfoliate the sheet from the semiconductor chip; and a sucking and holding step of sucking and holding an upper surface of the semiconductor chip thus exfoliated from the sheet by the pick-up head thereby to pick up the semiconductor chip, wherein, in the sheet exfoliating step, when the vacuum-sucking is performed through the suction surface, the semiconductor chip adhered to the sheet is bent and deformed in an almost same bent shape in a continuous bent range from an outer peripheral portion of one side of the chip to an outer peripheral portion of another one side of the chip thereby to exfoliate the sheet from a lower surface of the semiconductor chip.

Preferably, the semiconductor chip may bend and deform in a plurality of the bent ranges.

Preferably, the semiconductor chip may be configured in a rectangular shape, and the bent range be set in a direction which forms a predetermined angle with respect to one side of the semiconductor chip.

Preferably, the bent range includes a corner portion of the semiconductor chip.

According to second aspect of the invention, a semiconductor chip pick-up apparatus for picking up a semiconductor chip adhered to a sheet by using a pick-up head, includes: a holding table for holding the sheet; and a sheet exfoliation mechanism which is disposed beneath the holding table, a suction surface of the sheet exfoliation mechanism being abutted against a lower surface of the sheet to perform vacuum sucking through the suction surface thereby to exfoliate the sheet from the semiconductor chip, wherein the suction surface includes a plurality of suction grooves and a boundary portion which partitions the adjacent suction grooves, the boundary portion is abutted against the lower surface of the sheet to support the sheet at a time of the vacuum sucking, and air is vacuum-sucked from the suction grooves to bend and deform the semiconductor chip adhered to the sheet together with the sheet thereby to exfoliate the sheet from a lower surface of the semiconductor chip due to the bend deformation.

Preferably, the semiconductor chip may be supported by the plurality of boundary portions through the sheet.

Preferably, the semiconductor chip may be configured in a rectangular shape, and each of the suction grooves is provided in a direction which forms a predetermined angle with respect to one side of the rectangular-shaped semiconductor chip.

Preferably, the suction grooves may be arranged in a manner that corner portions of the semiconductor chip are not positioned just above the boundary portions when the suction surface is abutted against the lower surface of the sheet.

Preferably, the suction grooves may be provided at a suction exfoliation tool, and the suction exfoliation tool is attached to the sheet exfoliation mechanism so as to be exchanged freely.

According to third aspect of the invention, a suction exfoliation tool to be used in a semiconductor chip pick-up apparatus for picking up a semiconductor chip adhered to a sheet by using a pick-up head, the suction exfoliation tool to be attached to a sheet exfoliation mechanism which has a suction surface being abutted against a lower surface of the sheet to perform vacuum sucking through the suction surface thereby to exfoliate the sheet from the semiconductor chip, wherein the suction surface provided at the suction exfoliation tool includes a plurality of suction grooves and a boundary portion which partitions the adjacent suction grooves, the boundary portion is abutted against the lower surface of the sheet to support the sheet at a time of the vacuum sucking, and air is vacuum-sucked from the suction grooves to bend and deform the semiconductor chip adhered to the sheet together with the sheet thereby to exfoliate the sheet from a lower surface of the semiconductor chip due to the bend deformation.

In the sheet exfoliating step of abutting the suction surface against the lower surface of the sheet and performing the vacuum-sucking through the suction surface thereby to exfoliate the sheet from the semiconductor chip, the vacuum-sucking is performed through the suction surface to bend and deform the semiconductor chip adhered to the sheet together with the sheet thereby to exfoliate the sheet from the lower surface of the semiconductor chip due to the bent deformation. Thus, it is possible to realize the picking-up operation with high productivity without causing a lot of problems such as breakage or crack.

BRIEF DESCRIPTION OF THE DRAWINGS

FIG. 9 is a plane view of the suction exfoliation tool of the pick-up apparatus for semiconductor chips according to the embodiment of the invention.

DETAILED DESCRIPTION OF THE PREFERRED EMBODIMENTS

The embodiment of the invention will be explained with reference to the accompanying drawings.

Figure 1:
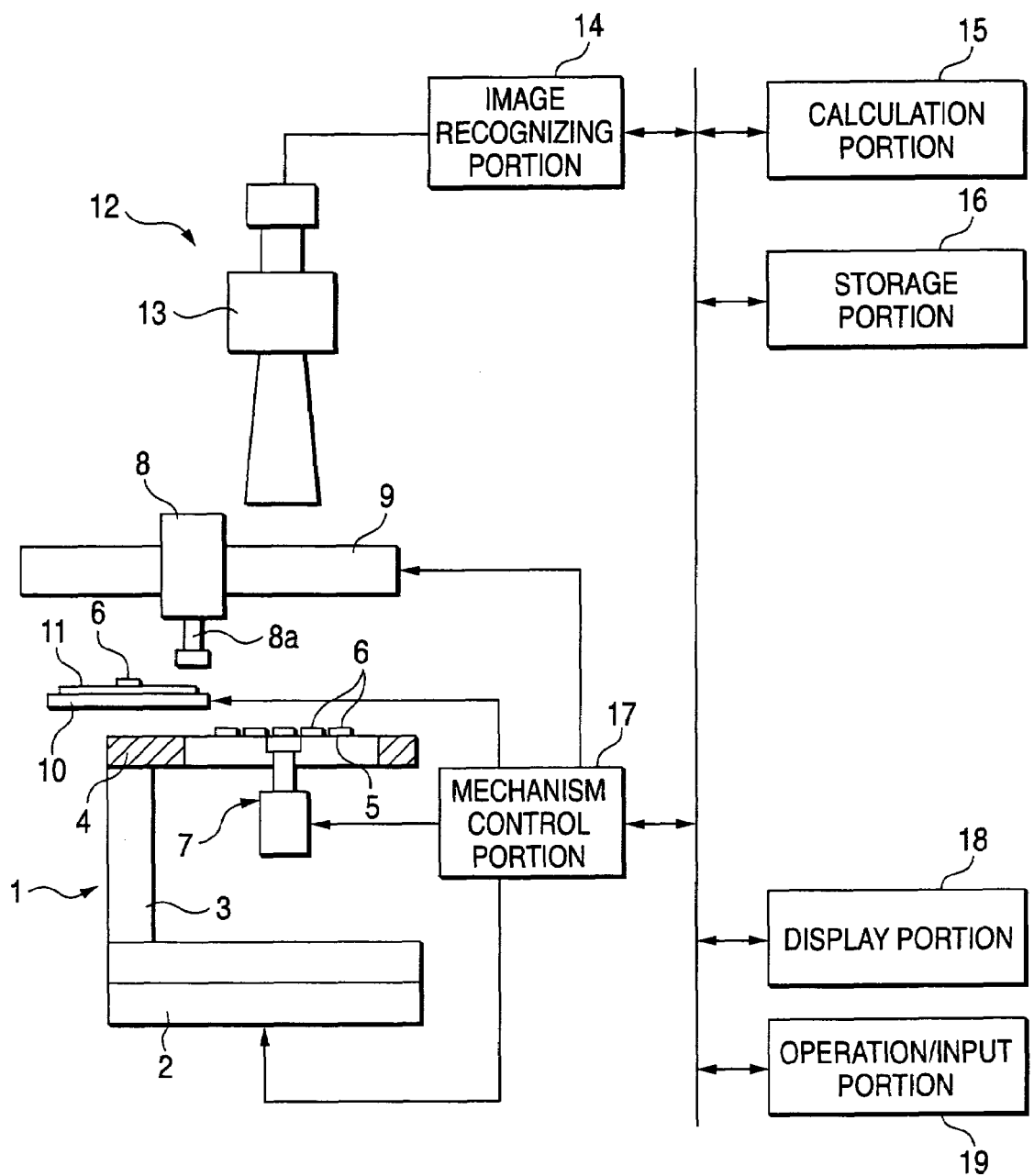
FIG. 1 is a block diagram showing the configuration of the pick-up apparatus for semiconductor chips according to the embodiment of the invention.

First, the configuration of the pick-up apparatus for semiconductor chips will be explained with reference to FIG. 1. In FIG. 1, a chip supply potion 1 is configured in a manner that a holding table 4 is combined on a bracket 3 which is erected from an XY table 2. A sheet 5, on which many semiconductor chips 6 (hereinafter simply referred as chips 6) each having a rectangular shape are adhered, is held on the holding table 4.

Each of the chips 6 is a thin chip formed through the thinning process and has such a property that it has small rigidity and liable to bend easily. Silicone resin (silicone rubber) being liable to bend is used as the material of the sheet 5 so that the sheet 5 can be bent and deformed easily together with the chips 6 in a state that the chips 6 are adhered on the sheet. In the sheet exfoliation operation described later, the sheet 5 is bent and deformed together with the chips 6 by using such a nature of the sheet, whereby the sheet 5 is exfoliated from the lower surface of the chips 6.

The smooth surface of the sheet 5 has an interfacial force for holding a solid surface made in contact with the smooth surface. When the chip 6 is pushed against the smooth surface, the chip 6 is adhered to and held by the sheet 5 in an adhesive state by means of the interfacial force. The sheet 5 may be fabricated by forming high molecular compound such as silicone gel, butyl rubber as well as silicone rubber in a film shape.

A sheet exfoliation mechanism 7 is disposed beneath the holding table 4. The sheet exfoliation mechanism 7 is provided with an adhesion surface which is made in contact with and sucks the lower surface of the sheet 5. In the sheet exfoliation process, the sheet is sucked at the adhesion surface by vacuum suction force, and so the sheet 5 is bent and deformed together with the chips 6.

A pick-up head 8 attached to a moving table 9 is disposed above the chip supply portion 1 so as to move freely in the horizontal direction. The chip 6 exfoliated from the sheet 5 is picked up by the suction nozzle 8a of the pick-up head 8 by means of the vacuum suction force. The chip 6 thus picked-up is mounted on a work 11 disposed on a substrate holding table 10 by the pick-up head 8 which is moved by the moving table 9.

A photographing portion 12 provided with a camera 13 is disposed above the holding table 4. The photographing portion 12 photographs the chip 6 on the sheet 5 and transmits image data thus photographed to an image recognizing portion 14. The image recognizing portion 14 subjects the image data thus transmitted to image processing to detect the position of the chip 6. A calculation portion 15 is a CPU which executes programs stored in a storage portion 16 to perform various kinds of operation processings and calculations. That is, the calculation portion receives recognition result from the image recognizing portion 14 and controls respective portions as explained below.

The storage portion 16 stores programs necessary for operating the respective portions and various kinds of data such as sizes of the chips 6 to be recognized and arrangement data of the chips on the sheet 5. A mechanism control portion 17 controls the pick-up head 8, the moving table 9 for moving the pick-up head, the sheet exfoliation mechanism 7 and the XY table 2. A display portion 18 displays images of the chips 6 having been photographed and screens at the time of an operation procedure and an input procedure. An operation/input portion 19 is an input device such as a keyboard for inputting operation instructions and data.

Figure 2:
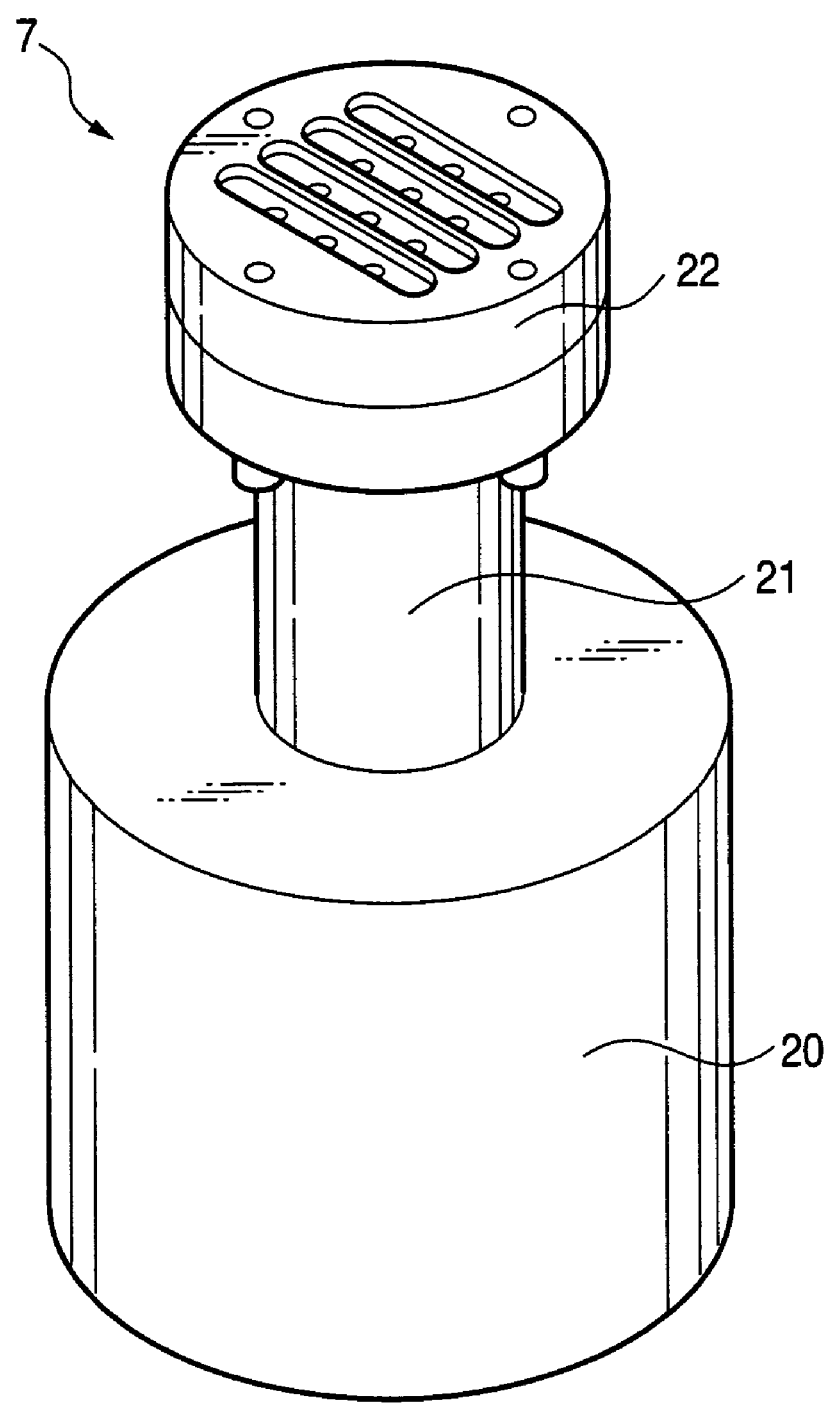
FIG. 2 is a perspective view of the sheet exfoliation mechanism of the pick-up apparatus for semiconductor chips according to the embodiment of the invention.

Next, the configuration of the sheet exfoliation mechanism 7 will be explained with reference to FIGS. 2 and 3. As shown in FIG. 2, the sheet exfoliation mechanism 7 is configured by a main mechanism body portion 20, a supporting shaft portion 21 held by the main mechanism body portion 20 so as to rotate freely, and suction exfoliation tools 22. The suction exfoliation tools 22 are prepared separately in accordance with the shapes and sizes of the chips 6, respectively. The suction exfoliation tool 22 can be attached on the upper surface of the supporting shaft portion 21 by using bolt holes 22e (see FIG. 4) and bolts 23 so as to be exchanged freely. So the suction exfoliation tool 22 is easily exchangeable.

The upper surface of the suction exfoliation tool 22 serves as an adhesion surface 22a which abuts against the sheet 5 to suck the lower surface of the sheet by the vacuum suction force. A plurality of linear suction grooves 22b are formed on the adhesion surface 22a. Suction holes 22c formed at the bottom portion of each of the suction grooves 22b communicate with the inner hole 21a of the supporting shaft portion 21. The inner hole 21a is coupled with a vacuum suction source 25, whereby air within the suction grooves 22b is sucked by driving the vacuum suction source 25. The plural suction holes 22c are provided at each of the suction grooves 22b and so the air within the suction groove 22b can be sucked even if one of the suction holes 22c provided at the suction groove is closed or choked.

Figure 3:
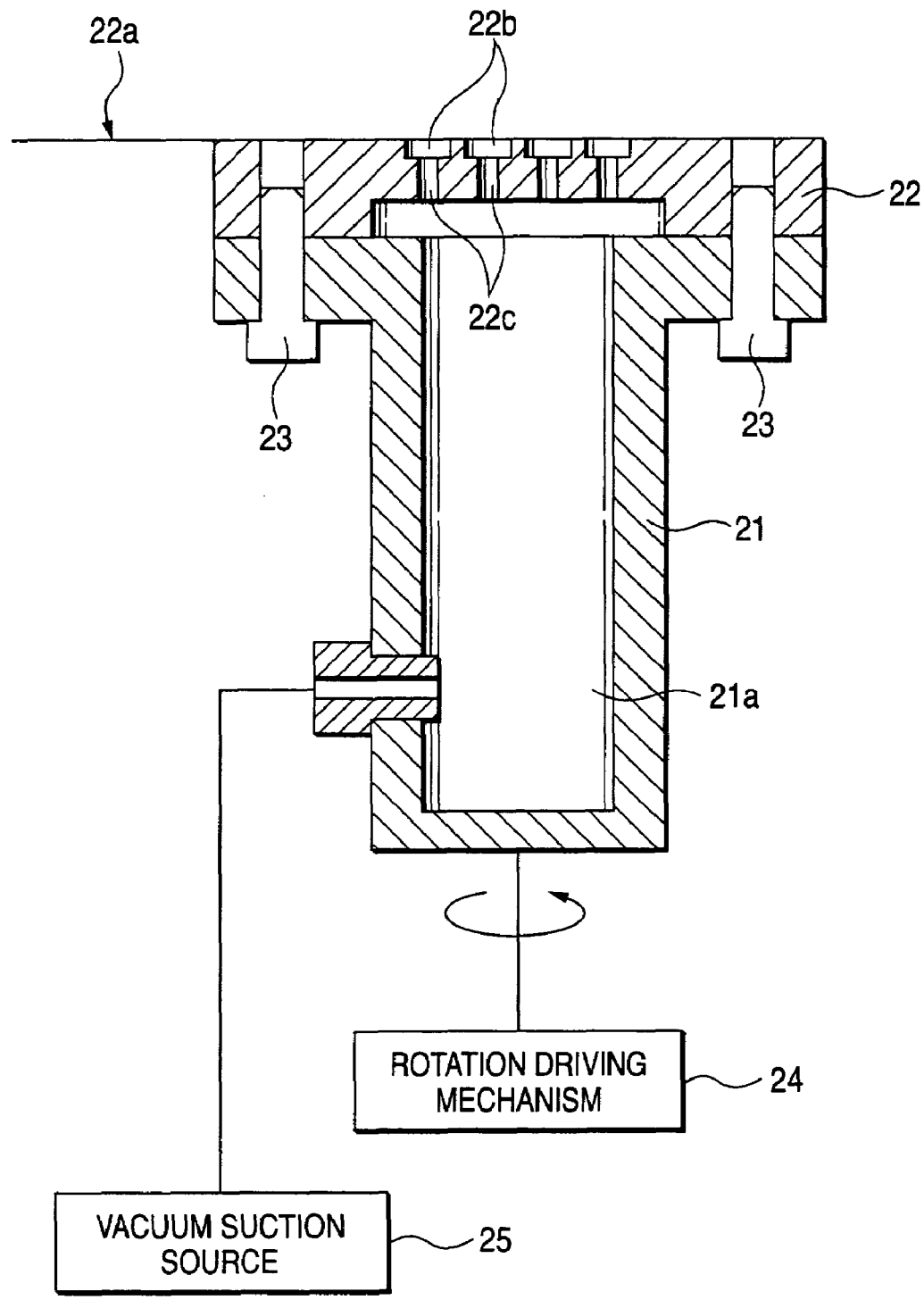
FIG. 3 is a fragmentary sectional view of the sheet exfoliation mechanism of the pick-up apparatus for semiconductor chips according to the embodiment of the invention.

A rotation driving mechanism 24 shown in FIG. 3 is incorporated within the main mechanism body portion 20. The suction exfoliation tool 22 can be rotated around a vertical shaft by the rotation driving mechanism 24. Thus, the angle of the adhesion surface 22a of the suction exfoliation tool 22 around the vertical shaft can be set to an arbitrary angle, so that, as described later, the angle of the suction groove 22b can be set to a predetermined angle optimum to the suction and exfoliation operation with respect to the one side of the rectangular chip 6 to be exfoliated. The apparatus may be configured in a manner that the holding table 4 is rotated by an angle θ instead of rotating the suction exfoliation tool 22. Further, the apparatus may not be provided with any rotation mechanism as described later.

Figure 4A:
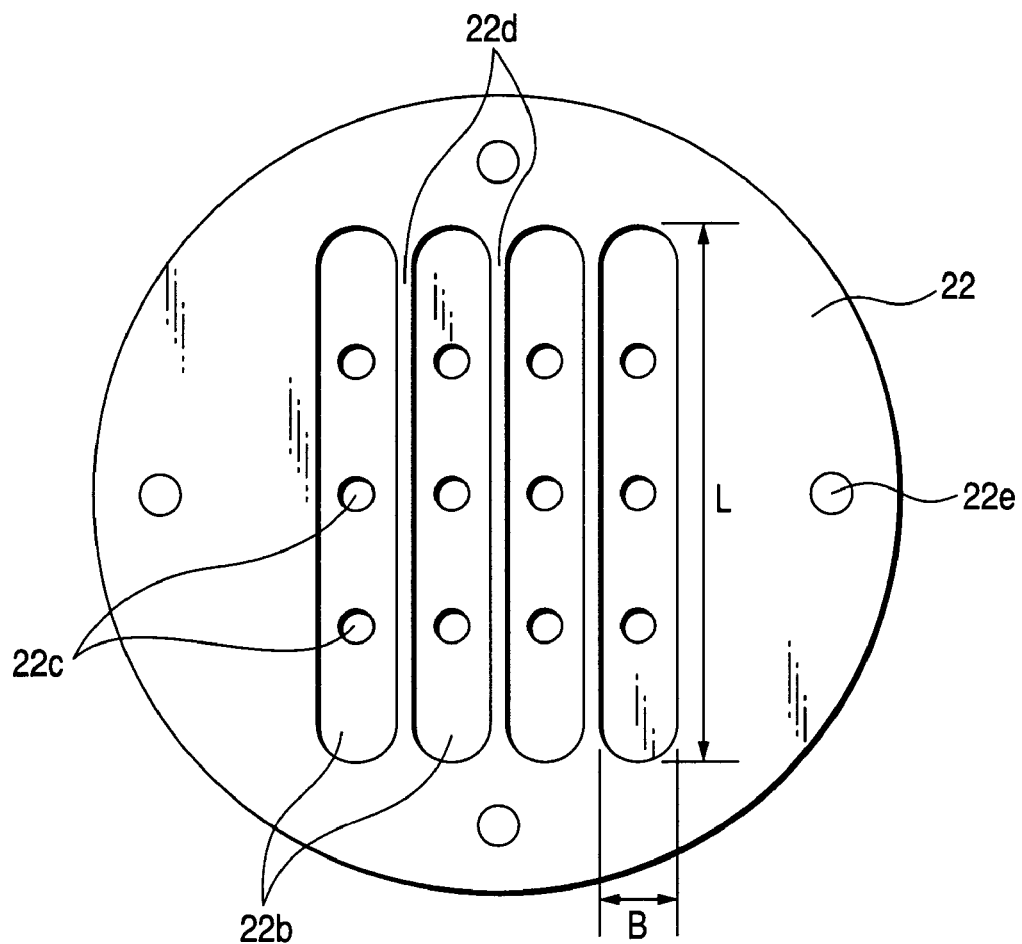
FIGS. 4A and 4B are diagrams for explaining the shape of the suction exfoliation tool of the pick-up apparatus for semiconductor chips according to the embodiment of the invention.
Figure 4B:
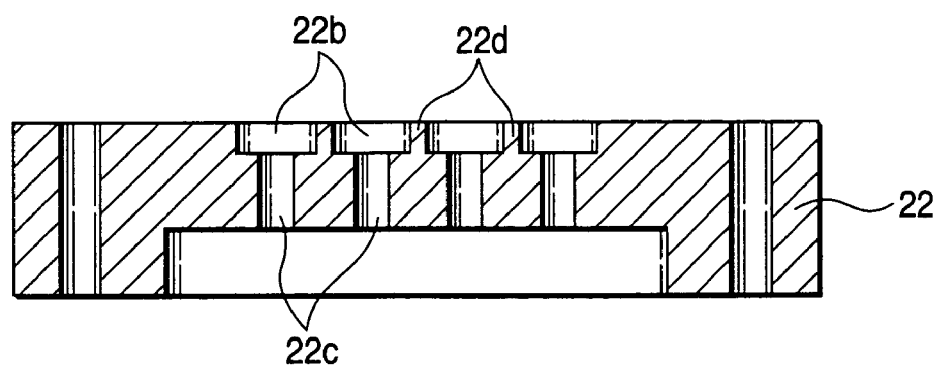

Next, the shape of the suction groove 22b formed at the adhesion surface 22a will be explained with reference to FIGS. 4A and 4B. As shown in FIGS. 4A and 4B, four suction grooves 22b each having a width B and a length L are formed on the adhesion surface 22a so as to be aligned from one another. The suction grooves are partitioned by boundary portions 22d from one another. Each of the suction grooves 22b is provided with no projection so as not to interfere the bending and deforming operation of the sheet 5 at the time of the suction procedure.

The width B and the length L of each of the suction grooves 22b and the aligned number of the suction grooves are set in accordance with the size of the chip 6 to be processed. Further, the width B of each of the suction grooves 22b and the relative position between the adhesion surface 22a and the chip 6 are set in a manner that the entire area corresponding to the single chip 6 is sucked by the plural suction grooves 22b and the end portions of the chip 6 are not positioned just above the boundary portions 22d in a state where the adhesion surface 22a is abutted against the lower surface of the sheet 5 (see FIGS. 5A and 5B).

At the time of performing the vacuum sucking by using the adhesion surface 22a, since the boundary portions 22d are formed on the same plane as the adhesion surface 22a, the upper surfaces of the plural boundary portions 22d which partition the plural suction grooves 22b abut against the lower surface of the sheet 5 thereby to support the sheet from the lower side thereof. That is, the chips 6 are also supported by the plural boundary portions 22d through the sheet 5 in the similar manner and so the posture of each of the chips 6 is held in a horizontal state in the suction procedure.

When the vacuum sucking operation is performed in this state, as described later, the chips 6 adhered to the sheet 5 are bent and deformed together with the sheet 5 and so the sheet 5 is exfoliated from the lower surfaces of the chips 6 due to the bending deformation. Each of the boundary portions 22d is not necessarily configured so as to partition the adjacent suction grooves 22b completely by a continuous partitioning plane but may be configured in an intermittent or discontinuous plane. Alternatively, each of the boundary portions may be configured in a manner that column-shaped partition portions whose upper surfaces are positioned at the same plane as the adhesion surface 22a are provided in a dotted line manner.

The pick-up apparatus for semiconductor chips according to the embodiment is configured in the aforesaid manner. Next, the exfoliating operation of the sheet 5 in the pick-up process of the chips 6 will be explained with reference to the drawings. First, the sheet 5 on which the chips 6 are adhered is held by the holding table 4 (see FIG. 1). Next, the adhesion surface 22a of the sheet exfoliation mechanism 7 is abutted against the lower surface of the sheet 5.

Figure 5A:
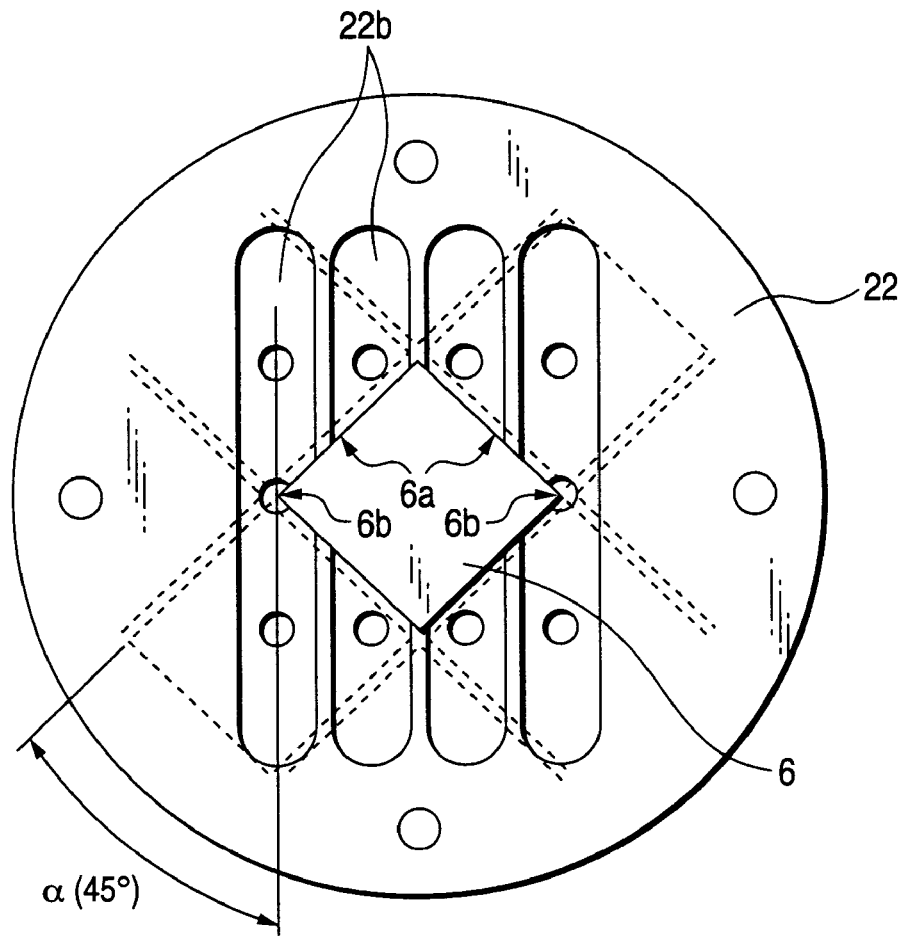
FIGS. 5A and 5B, 6A to 6C, 7A and 7B, and 8A to 8C are diagrams for explaining the sheet exfoliation operation in the semiconductor chip pick-up method according to the embodiment of the invention.
Figure 5B:
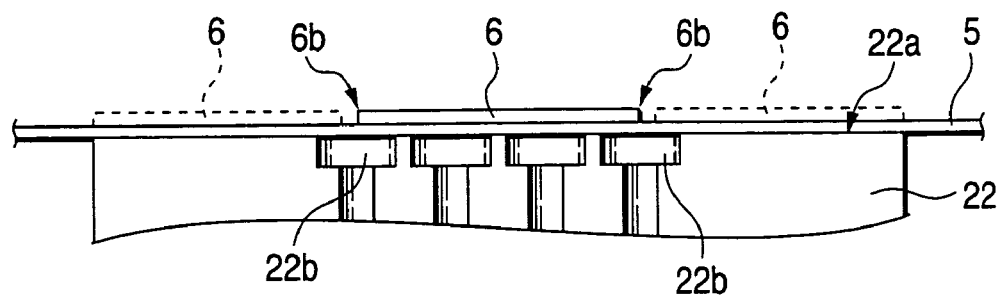

In this case, as shown in FIG. 5A, the rotation driving mechanism 24 of the sheet exfoliation mechanism 7 is driven to adjust the rotation angle of the suction exfoliation tool 22 so that the suction grooves 22b are set to a preset predetermined angle α (45 degrees in this example) with respect to the sides 6a of the chip 6 to be exfoliated. When there is no mechanism for rotating the tool, the suction exfoliation tool 22 may be designed, manufactured and disposed so that the suction grooves 22b are set to a preset predetermined angle α (45 degrees in this example) with respect to the sides 6a of the chip 6 to be exfoliated. The relative position of the sheet exfoliat ion mechanism 7 with respect to the sheet 5 is adjusted so that each of the corner portions 6b of the chip 6 is not positioned just above the boundary portion 22d but positioned at an almost center portion of the suction groove 22b along the width direction thereof. In FIGS. 5A to 8C, of all the chips 6 adhered on the sheet 5 in a matrix pattern, only the chip 6 to be subjected to the suction exfoliation operation is shown and the other chips are not shown.

Figure 6A:
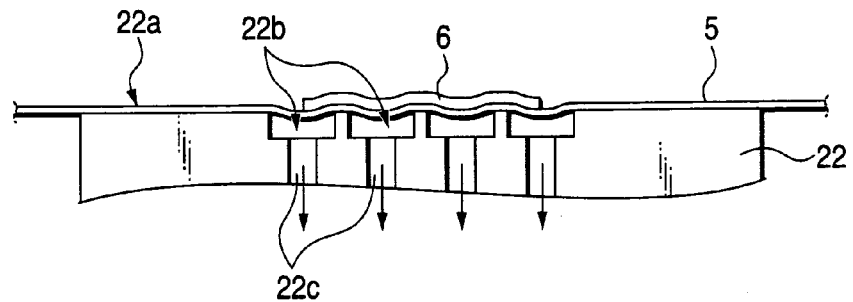

Next, the suction exfoliation operation is executed. First, the vacuum suction source 25 is driven to vacuum-suck the air through the suction holes 22c thereby to bend and deform the chip 6 adhered to the sheet 5 in a shape to be fit into the suction grooves 22b, as shown in FIG. 6A. The deforming operation in this case will be explained with reference to FIGS. 7A, 7B, 8A, 8B and 8C.

Figure 7A:
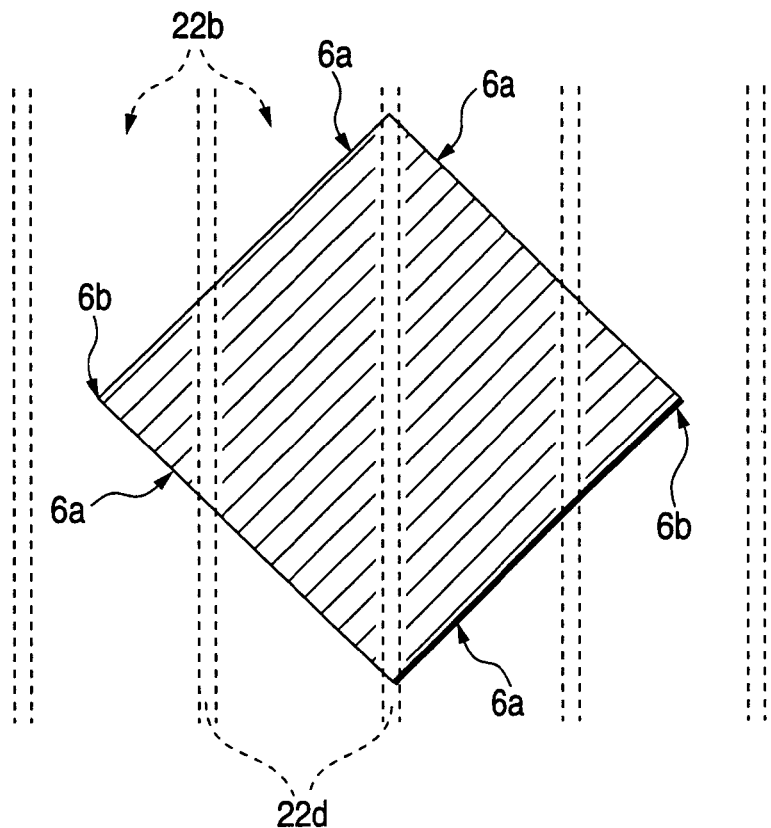
Figure 7B:
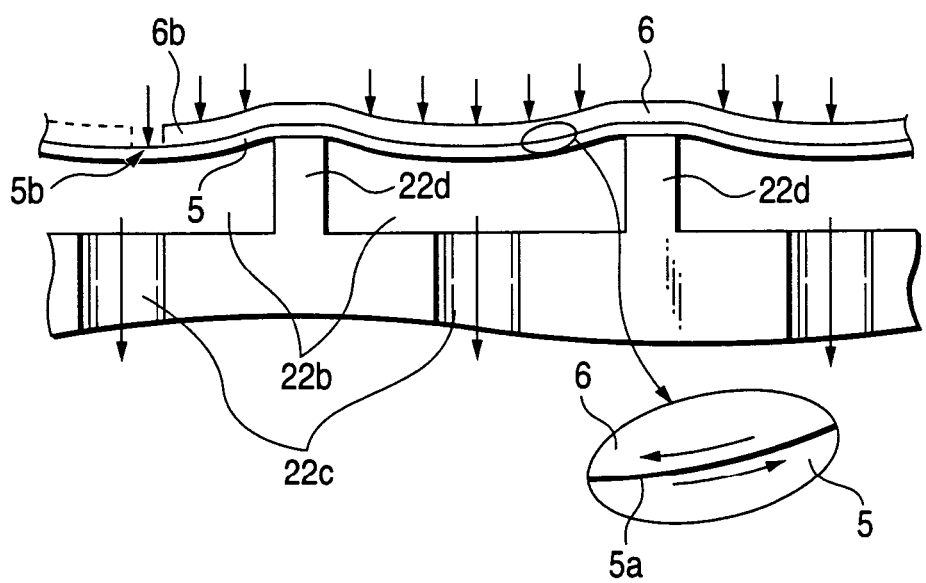

FIG. 7A shows the supporting position and the deformation range of the chip 6. In this example, the chip 6 is supported by the three boundary portions 22d from the lower side thereof in such a symmetrical manner that the boundary portion coincides with the diagonal line of the chip. When the air is vacuum-sucked in this state, as shown in FIG. 7B, equally distributed pressing force is applied onto the chip 6 from the upper direction due to a pressure difference caused by the vacuum sucking between the suction grooves 22b and the outside. Due to the pressing force, the chip 6 is bent and deformed downward in a convex shape together with the sheet 5. A pressing force due to the pressure difference directly acts on a sheet 5b in a range corresponding to the dicing grooves at the outside of the respective sides of the chip 6.

As shown by ranges of slanted lines between the respective boundary portions 22d in the plane view of FIG. 7A, the chip 6 bends and deforms in an almost same bent shape in a continuous bent range from the outer peripheral portion of the one side 6a of the chip 6 to the outer peripheral portion of another one side 6a. That is, the bending range is set in a direction which forms an angle α with respect the side 6a of the chip 6. In such a bent deformation, a deviation amount in a film surface direction differs due to the difference of mechanical nature between the chip 6 and the sheet 5. As a result, relative slip occurs at the adhesive boundary surface 5a between the chip 6 and the sheet 5.

Figure 8A:
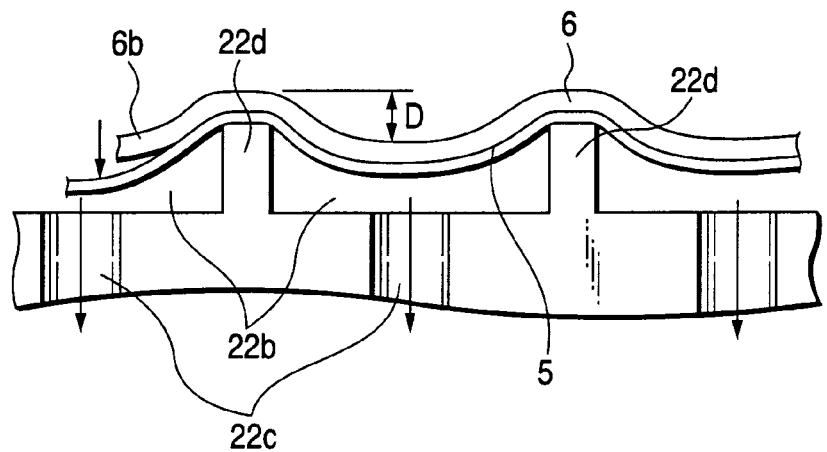
Figure 8B:
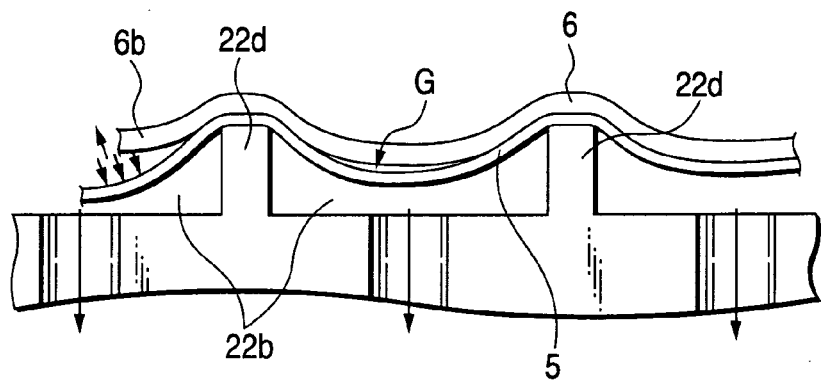

When the sucking operation through the suction holes 22c is further continued, a bent amount D increases thereby to cause a large bent deformation. Thus, the degree of the relative slip at the adhesive boundary surface 5a further increases and so the adhesion force between the chip 6 and the sheet 5 decreases. With the decrease of the adhesion force, as shown in FIG. 8B, an opening motion (see a gap G shown by an arrow in the figure) such that the adhesive boundary surface 5a partially separates is apt to occur at the outer peripheral portion of the chip 6.

Figure 8C:
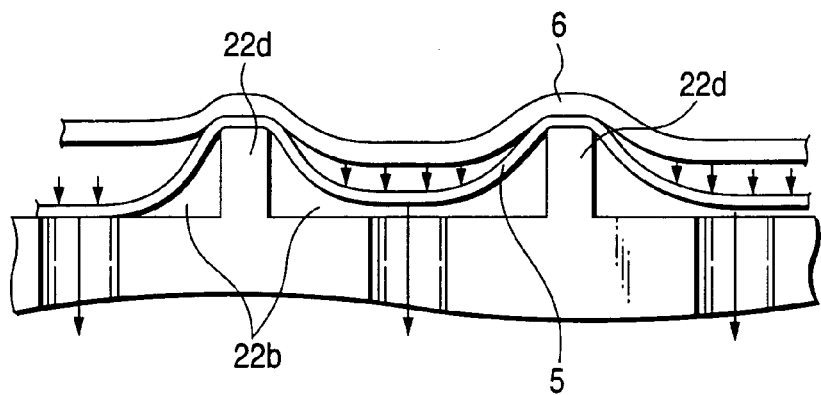

Such an opening motion occurs remarkably at the corner portions 6b each having a protrusive shape among the outer peripheral portions of the chip 6. When such an opening motion occurs once, a pressing force corresponding to the pressure difference between the insides of the suction grooves 22b and the outside acts at the portion of the sheet 5 where the opening motion occurs, whereby the opening motion is further promoted. The portion near the corner portion 6b separated from the sheet 5 due to the opening motion is reduced in its bent amount due to the elastic restoring force of the chip 6, which then acts to promote the opening motion between the sheet 5 and the chip 6 thereby to develop the exfoliation. In this manner, when the opening motion is promoted, only the sheet 5 is pushed down by the vacuum sucking force through the suction holes 22c. Thus, as shown in FIG. 8C, the sheet 5 is exfoliated from the chip 6 over the entire lower surface of the chip.

Figure 6B:
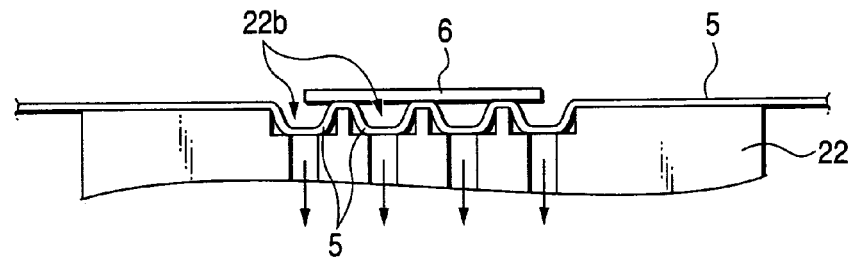
Figure 6C:
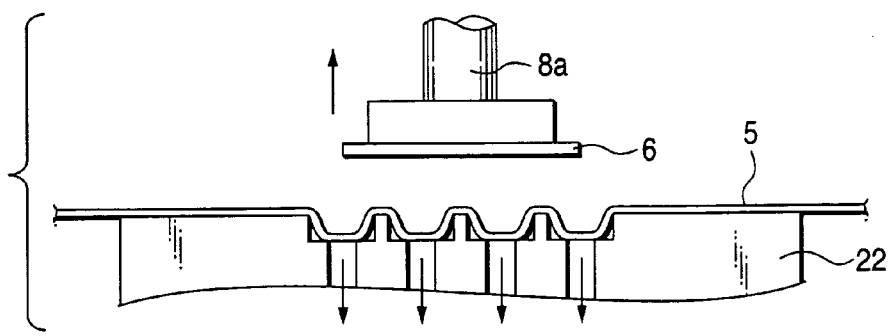

Thereafter, the sheet 5 is further exfoliated from the chip 6 and when the sheet 5 is placed in a state where the sheet is sucked and adhered to the suction holes 22c within the suction grooves 22b as shown in FIG. 6B, the bent deformation of the chip 6 is eliminated due to the elastic restoring force thereof and so the chip restores in a planer state. In this case, since the plural suction holes 22c are provided within the suction groove 22b, even if one of the suction holes 22c is closed or choked by the sheet 5, the vacuum sucking operation can be continued through another one of the suction holes 22c. This suction exfoliation operation is completed within a short time period of several tens milli-seconds and so the sheet can be exfoliated quite efficiently. Then, as shown in FIG. 6C, the suction nozzle 8a is elevationally moved with respect to the chip 6 thereby to take out the chip, whereby the pick-up operation of the chip 6 is completed.

As explained above, in the sheet exfoliating operation shown in this embodiment, the chip 6 is largely bent and deformed together with the sheet 5 to such a degree that the adhesion force at the adhesive boundary surface of the chip 6 decreases to cause the opening motion between the sheet 5 and the chip, whereby the exfoliation of the chip 6 from the sheet 5 is transmitted to the entire surface of the chip from the opening motion point thus occurred.

Thus, as compared with the conventional method which requires the auxiliary means for accelerating the exfoliating process of the sheet such that the vacuum sucking surface is moved relatively on the lower surface of the sheet along the lower surface to lower an adhesive force between the sheet and the chip, the embodiment can realize the quite excellent sheet exfoliation method.

That is, in the exfoliation operation, it is merely required to abut the adhesion surface 22a of the tool 20 against the sheet 5 to perform the vacuum suction. Thus, in the embodiment, the complicated control of the mechanical system which has been indispensable in the conventional technique can be eliminated and further there does not arise the delay due to the tact time caused by the repetition of the complicated operation at every picking-up operation. Accordingly, such a problem as breakage or crack of a thin-type semiconductor chip can be prevented and it is possible to realize a high productivity.

As to the shape and the arrangement of the suction grooves of the suction exfoliation tool 22, instead of arranging the plural suction grooves each having the same configuration, suction grooves respectively having different shapes as shown in FIG. 9 may be combined. In the example shown in this figure, on the upper surface of a suction exfoliation tool 32, three suction grooves 32a each having a width B1 are aligned and further two suction grooves 32b each having a width B2 larger than B1 are disposed at the outsides of these three suction grooves, respectively. Each of the suction grooves 32a, 32b are provided with suction holes 32c. When the width of each of the suction grooves 32b disposed at the outsides is made larger in this manner, the extended margin of each of the corner portions 6b of the chip 6 can be secured to be large, whereby the opening motion can be likely caused advantageously.

Further, according to the aforesaid embodiment, the diagonal direction of the chip 6 is aligned with the direction of the suction groove 22b so that the side 6a of the chip 6 is set so as to form an angle of 45 degrees with respect to the suction groove 22b. It is proved that such a setting is desirable in many cases. However, the side 6a may be set to be almost aligned with the suction groove 22b depending on the combination of the conditions such as the rigidity of the chip 6 and the sheet 5, the width B of the suction groove 22b and the vacuum suction force. In brief, it is sufficient only when such a condition is realized that the chip is bent and deformed to a degree sufficient for causing the opening motion at the adhesive boundary surface of the outer peripheral portion of the chip 6 due to the vacuum sucking.

The chip 6 may be sucked by the suction nozzle 8a during the operation of the sheet exfoliation mechanism shown in the embodiment by lowering the suction nozzle 8a with respect to the chip 6. In this case, the suction force of the suction nozzle 8a with respect to the chip 6 is set not to exceed the pressing force caused at the chip 6 by the vacuum suction from the suction holes 22c. Thus, the chip can be bent and deformed to a degree sufficient for causing the opening motion at the adhesive boundary surface of the outer peripheral portion of the chip 6.

As described above, according to the invention, since the suction surface is abutted against the lower surface of the sheet, then the vacuum sucking is performed through the suction surface thereby to bend and deform the semiconductor chip adhered to the sheet together with the sheet, whereby the sheet is exfoliated from the lower surface of the semiconductor chip due to the bending deformation. Thus, it is possible to realize the picking-up operation with high productivity without causing a lot of problem such as breakage or crack.

What is claimed is:

1. A semiconductor chip pick-up method for picking up a semiconductor chip adhered to a sheet by using a pick-up head, comprising:

a sheet exfoliating step for abutting a suction surface of a sheet exfoliation mechanism against a lower surface of the sheet and for performing vacuum-sucking through the suction surface thereby to exfoliate the sheet from the semiconductor chip; and a sucking and holding step of sucking and holding an upper surface of the semiconductor chip thus exfoliated from the sheet by the pick-up head thereby to pick up the semiconductor chip, wherein in the sheet exfoliating step, when the vacuum-sucking is performed through the suction surface, the semiconductor chip adhered to the sheet is bent and deformed by a vacuum suction force in an almost same bent shape in a continuous bent range from an outer peripheral portion of one side of the chip to an outer peripheral portion of another one side of the chip thereby to exfoliate the sheet from a lower surface of the semiconductor chip using due to the bend deformation only the vacuum suction force, wherein the semiconductor chip is configured in a rectangular shape, and the bent range is set in a direction which forms a predetermined angle with respect to one side of the semiconductor chip, wherein the bent range includes a corner portion of the semiconductor chip, wherein the predetermined angle is about 45 degrees; and wherein when the vacuum-sucking is performed, the sheet together with the semiconductor chip is bent toward a source of the vacuum suction from a flat plane in which the sheet is abutted against the suction surface of the exfoliation mechanism.

2. A semiconductor chip pick-up method according to claim 1, wherein the semiconductor chip bends and deforms in a plurality of the bent ranges.

3. A semiconductor chip pick-up apparatus for picking up a semiconductor chip adhered to a sheet by using a pick-up head, comprising:
   a holding table for holding the sheet, and
   a sheet exfoliation mechanism which is disposed beneath the holding table, a suction surface of the sheet exfoliation mechanism being abutted against a lower surface of the sheet to perform vacuum sucking through the suction surface thereby to exfoliate the sheet from the semiconductor chip,
   wherein the suction surface includes a plurality of suction grooves and a boundary portion which partitions the adjacent suction grooves, the boundary portion is abutted against the lower surface of the sheet to support the sheet at a time of the vacuum sucking, and air is vacuum-sucked from the suction grooves to bend and deform the semiconductor chip adhered to the sheet together with the sheet thereby to exfoliate the sheet from a lower surface of the semiconductor chip due to the bend deformation using only a vacuum suction force,
   wherein the semiconductor chip is configured in a rectangular shape, and each of the suction grooves is provided in a direction which forms a predetermined angle with respect to one side of the rectangular-shaped semiconductor chip,
   wherein the suction grooves are arranged in a manner that corner portions of the semiconductor chip are not positioned just above the boundary portions when the suction surface is abutted against the lower surface of the sheet; and
   wherein the boundary portion is arranged in a same flat plane as the suction surface so that the sheet together with the semiconductor chip is bent toward a source of the vacuum sucking from the flat plane,
   wherein at least one of the plurality of suction grooves is linear and includes at least one hole through a bottom surface of the suction groove, the at least one hole being in fluid communication with the vacuum suction source.

4. A semiconductor chip pick-up apparatus according to claim 3, wherein the semiconductor chip is supported by the plurality of boundary portions through the sheet.

5. A semiconductor chip pick-up apparatus according to claim 3, wherein the suction grooves are provided at a suction exfoliation tool, and the suction exfoliation tool is attached to the sheet exfoliation mechanism so as to be exchanged freely.

6. The semiconductor chip pick-up apparatus of claim 3 wherein each of the plurality of suction grooves is provided with a plurality of suction holes, through which the air is vacuum-sucked.

7. The semiconductor chip pick-up apparatus of claim 3 wherein the sheet exfoliation mechanism includes a main body portion, a supporting shaft portion, and a suction exfoliation tool, wherein the suction exfoliation tool is removably attached to the support shaft portion.

8. A suction exfoliation tool for use in a semiconductor chip pick-up apparatus for picking up a semiconductor chip adhered to a sheet by using a pick-up head, comprising:
   a suction exfoliation tool to be attached to a sheet exfoliation mechanism which has a suction surface being abutted against a lower surface of the sheet to perform vacuum sucking through the suction surface thereby to exfoliate the sheet from the semiconductor chip,
   wherein the suction surface provided at the suction exfoliation tool includes a plurality of suction grooves and a boundary portion which partitions the adjacent suction grooves, the boundary portion is abutted against the lower surface of the sheet to support the sheet at a time of the vacuum sucking, and air is vacuum-sucked from the suction grooves to bend and deform the semiconductor chip adhered to the sheet together with the sheet thereby to exfoliate the sheet from a lower surface of the semiconductor chip due to the bend deformation using only a vacuum suction force,
   wherein the semiconductor chip is configured in a rectangular shape, and each of the suction grooves is provided in a direction which forms a predetermined angle with respect to one side of the rectangular-shaped semiconductor chip,
   wherein the suction grooves are arranged in a manner that corner portions of the semiconductor chip are not positioned just above the boundary portions when the suction surface is abutted against the lower surface of the sheet; and
   wherein the boundary portion is arranged in a same flat plane as the suction surface so that the sheet together with the semiconductor chip is bent toward a source of the vacuum sucking from the flat plane.

9. A semiconductor chip pick-up method for picking up a semiconductor chip adhered to a sheet by using a pick-up head, comprising the steps of:
   abutting a suction surface of a sheet exfoliation mechanism against a lower surface of the sheet;
   performing vacuum-sucking through the suction surface thereby to exfoliate the sheet from the semiconductor chip, the semiconductor chip adhered to the sheet being bent and deformed by a vacuum suction force in an almost same bent shape in a continuous bent range from an outer peripheral portion of one side of the chip to an outer peripheral portion of another one side of the chip thereby to exfoliate the sheet from a lower surface of the semiconductor chip due to the bend deformation using only the vacuum suction force; and
   picking up the semiconductor chip by sucking and holding an upper surface of the semiconductor chip by the pick-up head,
   wherein the semiconductor chip is configured in a rectangular shape, and the bent range is set in a direction which forms a predetermined angle with respect to one side of the semiconductor chip,
   wherein the bent range includes a corner portion of the semiconductor chip, and
   wherein the predetermined angle is about 45 degrees,
   wherein when the vacuum-sucking is performed, the sheet together with the semiconductor chip is bent toward a source of the vacuum suction from a flat plane in which the sheet is abutted against the suction surface of the exfoliation mechanism.

* * * * *

UNITED STATES PATENT AND TRADEMARK OFFICE
CERTIFICATE OF CORRECTION

PATENT NO. : 7,632,374 B2
APPLICATION NO. : 10/620184
DATED : December 15, 2009
INVENTOR(S) : Ozono et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 832 days.

Signed and Sealed this

Second Day of November, 2010

David J. Kappos
*Director of the United States Patent and Trademark Office*